(12) United States Patent
Su et al.

(10) Patent No.: US 11,538,933 B2
(45) Date of Patent: Dec. 27, 2022

(54) SCHOTTKY DIODE INTEGRATED INTO SUPERJUNCTION POWER MOSFETS

(71) Applicant: Alpha and Omega Semiconductor (Cayman) Ltd., Grand Cayman (KY)

(72) Inventors: Yi Su, Cupertino, CA (US); Madhur Bobde, Sunnyvale, CA (US)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 206 days.

(21) Appl. No.: 17/039,703

(22) Filed: Sep. 30, 2020

(65) Prior Publication Data
US 2021/0020773 A1    Jan. 21, 2021

Related U.S. Application Data

(63) Continuation of application No. 15/843,327, filed on Dec. 15, 2017, now Pat. No. 10,818,788.

(51) Int. Cl.
| | |
|---|---|
| *H01L 29/78* | (2006.01) |
| *H01L 21/266* | (2006.01) |
| *H01L 21/28* | (2006.01) |
| *H01L 21/306* | (2006.01) |
| *H01L 21/321* | (2006.01) |

(Continued)

(52) U.S. Cl.
CPC ........ *H01L 29/7806* (2013.01); *H01L 21/266* (2013.01); *H01L 21/28035* (2013.01); *H01L 21/30604* (2013.01); *H01L 21/3212* (2013.01); *H01L 29/0634* (2013.01); *H01L 29/0696* (2013.01); *H01L 29/086* (2013.01); *H01L 29/1095* (2013.01); *H01L 29/4236* (2013.01); *H01L 29/45* (2013.01); *H01L 29/47* (2013.01); *H01L 29/66143* (2013.01);

(Continued)

(58) Field of Classification Search
CPC ............... H01L 29/7806; H01L 21/266; H01L 21/28035; H01L 21/30604; H01L 21/3212; H01L 29/0634; H01L 29/0696; H01L 29/086; H01L 29/1095; H01L 29/4236; H01L 29/45; H01L 29/47; H01L 29/66143; H01L 29/66734; H01L 29/7811; H01L 29/7813; H01L 29/872
See application file for complete search history.

(56) References Cited

U.S. PATENT DOCUMENTS

| | | |
|---|---|---|
| 5,365,102 A | 11/1994 | Mehrotra et al. |
| 6,078,090 A | 6/2000 | Williams et al. |

(Continued)

OTHER PUBLICATIONS

Final Office Action for U.S. Appl. No. 15/843,327, dated Nov. 19, 2019.

(Continued)

*Primary Examiner* — Benjamin Tzu-Hung Liu
(74) *Attorney, Agent, or Firm* — JDI Patent; Joshua Isenberg; Robert Pullman (57) ABSTRACT

A trench metal-oxide-semiconductor field-effect transistor (MOSFET) device comprises an active cell area including a plurality of superjunction trench power MOSFETs, and a Schottky diode area including a plurality of Schottky diodes formed in the drift region having the superjunction structure. Each of the integrated Schottky diodes includes a Schottky contact between a lightly doped semiconductor layer and a metallic layer.

20 Claims, 6 Drawing Sheets

(51) Int. Cl.
- H01L 29/06 (2006.01)
- H01L 29/08 (2006.01)
- H01L 29/10 (2006.01)
- H01L 29/423 (2006.01)
- H01L 29/45 (2006.01)
- H01L 29/66 (2006.01)
- H01L 29/872 (2006.01)
- H01L 29/47 (2006.01)

(52) U.S. Cl.
CPC .... *H01L 29/66734* (2013.01); *H01L 29/7811* (2013.01); *H01L 29/7813* (2013.01); *H01L 29/872* (2013.01)

(56) References Cited

U.S. PATENT DOCUMENTS

| | | |
|---|---|---|
| 6,351,018 B1 | 2/2002 | Sapp |
| 6,621,107 B2 | 9/2003 | Blanchard et al. |
| 8,324,053 B2 * | 12/2012 | Bobde ................ H01L 29/7805 257/329 |
| 8,431,470 B2 | 4/2013 | Lui et al. |
| 8,466,510 B2 | 6/2013 | Guan et al. |
| 8,476,698 B2 | 7/2013 | Guan et al. |
| 8,502,302 B2 | 8/2013 | Su et al. |
| 8,785,270 B2 | 7/2014 | Su et al. |
| 8,828,857 B2 * | 9/2014 | Lui ..................... H01L 27/0629 257/284 |
| 8,829,614 B2 | 9/2014 | Guan et al. |
| 8,900,949 B2 | 12/2014 | Guan et al. |
| 8,975,720 B2 | 3/2015 | Guan et al. |
| 9,356,132 B2 | 5/2016 | Su et al. |
| 9,431,481 B2 | 8/2016 | Lee |
| 9,859,370 B2 | 1/2018 | Nagai et al. |
| 9,876,073 B2 | 1/2018 | Guan et al. |
| 2013/0075808 A1 | 3/2013 | Calafut et al. |
| 2014/0124855 A1* | 5/2014 | Hebert ................ H01L 29/0623 257/334 |
| 2015/0279946 A1 | 10/2015 | Henson |
| 2016/0099351 A1 | 4/2016 | Hébert et al. |
| 2016/0300924 A1 | 10/2016 | Calafut et al. |
| 2017/0330962 A1 | 11/2017 | Zeng et al. |

OTHER PUBLICATIONS

Non-Final Office Action for U.S. Appl. No. 15/843,327, dated Dec. 6, 2018.

Non-Final Office Action for U.S. Appl. No. 15/843,327, dated Jun. 10, 2019.

Non-Final Office Action for U.S. Appl. No. 15/843,327, dated Mar. 20, 2020.

Notice of Allowance for U.S. Appl. No. 15/843,327, dated Jun. 25, 2020.

* cited by examiner

SCHOTTKY DIODE INTEGRATED INTO SUPERJUNCTION POWER MOSFETS

CLAIM OF PRIORITY

This application is a continuation of U.S. patent application Ser. No. 15/843,327 filed Dec. 15, 2017, the entire contents of which are incorporated herein by reference.

FIELD OF THE DISCLOSURE

This disclosure relates in general to metal-oxide-semiconductor field-effect transistors (MOSFETs) and more specifically to a superjunction power MOSFET and a method for fabricating the same.

BACKGROUND OF INVENTION

Integrated circuits, such as microprocessors and memory devices, include many metal-oxide-semiconductor field-effect transistors (MOSFETs). MOSFETs are typically used for amplifying or switching electronic signals. A MOSFET device for power switching is sometimes referred to as a power MOSFET. Most power MOSFETs feature a vertical structure with source and drain regions on opposite sides of a gate trench filled with polysilicon as gate electrodes.

Power MOSFET devices typically contain multiple individual MOSFET structures arranged in active cells. Schottky diodes are commonly used in low voltage power MOSFET devices (e.g., less than 40 volts). They help improve the diode recovery portion of the device switching behavior and reduce power loss due to their relatively lower forward voltage. In addition, the fast turn on and turn off of MOSFETs in some applications, such as DC-DC converter, may cause switch-node ringing with voltage spikes. A Schottky diode clamped to the MOSFET device may reduce these voltage spikes.

On the other hand, superjunction structures have been employed for high voltage power MOSFET devices (e.g., over 500 volts) to provide a way to achieve low on-resistance ($R_{ds-on}$), while maintaining a high off-state breakdown voltage (BV). In a power MOSFET, it is desirable to reduce the resistance of the device during conduction ($R_{ds-on}$) and improve its breakdown voltage (BV). However, the on-resistance ($R_{ds-on}$) and the breakdown voltage (BV) are in a tradeoff relation with respect to each other. That is, the on-resistance ($R_{ds-on}$) increases dramatically with an increase in breakdown voltage (BV) for a conventional transistor. Since superjunction devices include alternating p-type and n-type doped columns arranged in parallel and connected to each other in the drift region, these charge balanced columns deplete one another laterally when a reverse-bias voltage is applied to between the drain and the source. As such, superjunction devices can withstand a high breakdown voltage in the vertical direction while having significantly lower on-resistance ($R_{ds-on}$) than a conventional MOSFET device for the same high breakdown voltage (BV) (or conversely may have a significantly higher breakdown voltage BV than a conventional MOSFET for a given on-resistance $R_{ds-on}$).

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general terms, an n+ material has a higher n type net dopant (e.g., electron) concentration than an n material, and an n material has a higher carrier concentration than an n− material. Similarly, a p+ material has a higher p type net dopant (e.g., hole) concentration than a p material, and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped". As used herein, a high voltage device is a device with an operating voltage above 400 V. A medium voltage device has an operating voltage between about 40 V and about 400 V and a low voltage device has an operating voltage less than 40 V, preferably between about 8 V and about 40 V.

INTRODUCTION

While superjunction devices are usually employed in high voltage applications, it has been proposed to use them in low voltage applications. In one example, superjunction devices may be used in low-voltage hot-swap applications. A relatively high voltage between drain and source and high current during hot swap would cause device failure. Superjunction structures help reduce the high electric field from trench electrodes and thus prevent breakdown and improve performance.

Aspects of the present disclosure describe Schottky diodes integrated with a superjunction power MOSFET device that may be used in low voltage applications as well as medium or high voltage applications. The Schottky diode may reduce the body diode forward voltage drop ($V_f$) and minimize the stored charge and have a quick reverse recovery time, thereby making the MOSFET device more efficient. According to some aspects of the present disclosure, the Schottky contact may be formed along the sidewalls of Schottky contact trenches. According to other aspects of the present disclosure, the Schottky contact may be formed on the surface of the lightly doped semiconductor layer between p columns of the superjunction structure.

Figure 1:
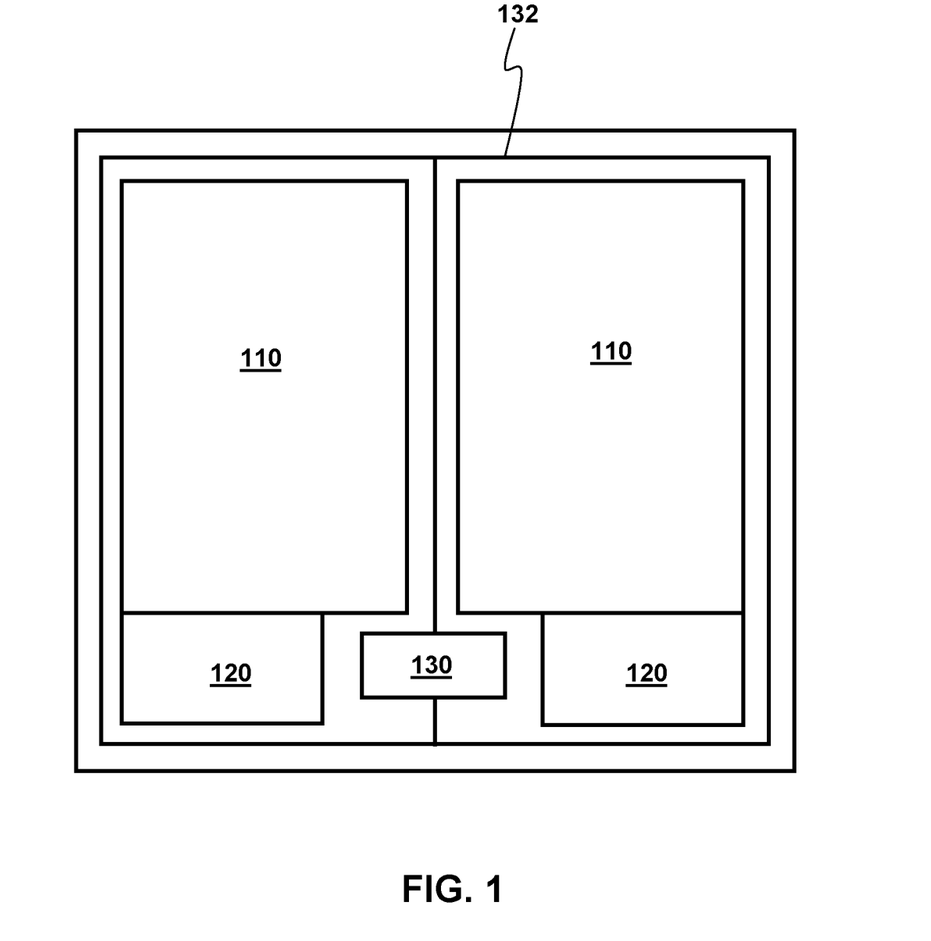
FIG. 1 is an overhead view of portions of a power MOSFET device according to aspects of the present disclosure.

FIG. 1 shows an overhead view of portions of a power MOSFET device according to aspects of the present disclosure. The power MOSET device 100 includes an active cell area 110 and a Schottky diode area 120. In some implementations, the active cell area 110 and Schottky diode area 120 are included in the active cell region in a power MOSFET device. The active cell area 110 includes an array of device cells with a superjunction structure. Each of the device cells in the device has a gate electrode in a device trench (or a gate trench). The gate electrodes may be connected to a gate pad 130 via gate runner 132. The source region of the device cells may be connected to a source pad (not shown) inside the active cell area 110. The Schottky diode area 120 has a plurality of Schottky diodes. The Schottky diodes may be coupled to the gate pad 130 and the source pad in the active cell area 110 for appropriate connection. The area for Schottky diodes is smaller than the area for the device cells. By way of example and not by way of limitation, the area for the Schottky diodes (i.e., the Schottky diode area 120) is about 10% to 15% of the entire active cell region area of the power MOSFET device 100. It should be noted that FIG. 1 shows one possible layout of a power MOSFET device according to one aspect of the present disclosure. Other aspects of the present disclosure may include alternative device layouts. In some embodiments, there may include a plurality of Schottky diode areas surrounding multiple active cell areas 110. In some embodiments, multiple Schottky diode areas are situated among the active cell areas 110. In addition, the gate electrodes may be in a striped orientation, but alternative aspects of the present disclosure may also include alternative device layouts, such as, but not limited to a closed cell orientation.

In the following examples, the power MOSFET device is described as an n-type superjunction trench MOSFET device in which the source region and drain region for the device cells have n type conductivity and the body region has p type conductivity. It is noted that these conductivity types may be reversed in order to obtain a p-type superjunction trench MOSFET. It is also noted that a power MOSFET device according to aspects of the present disclosure may be a single poly MOSFET device or a shielded gate trench MOSFET device.

First Example

Figure 2:
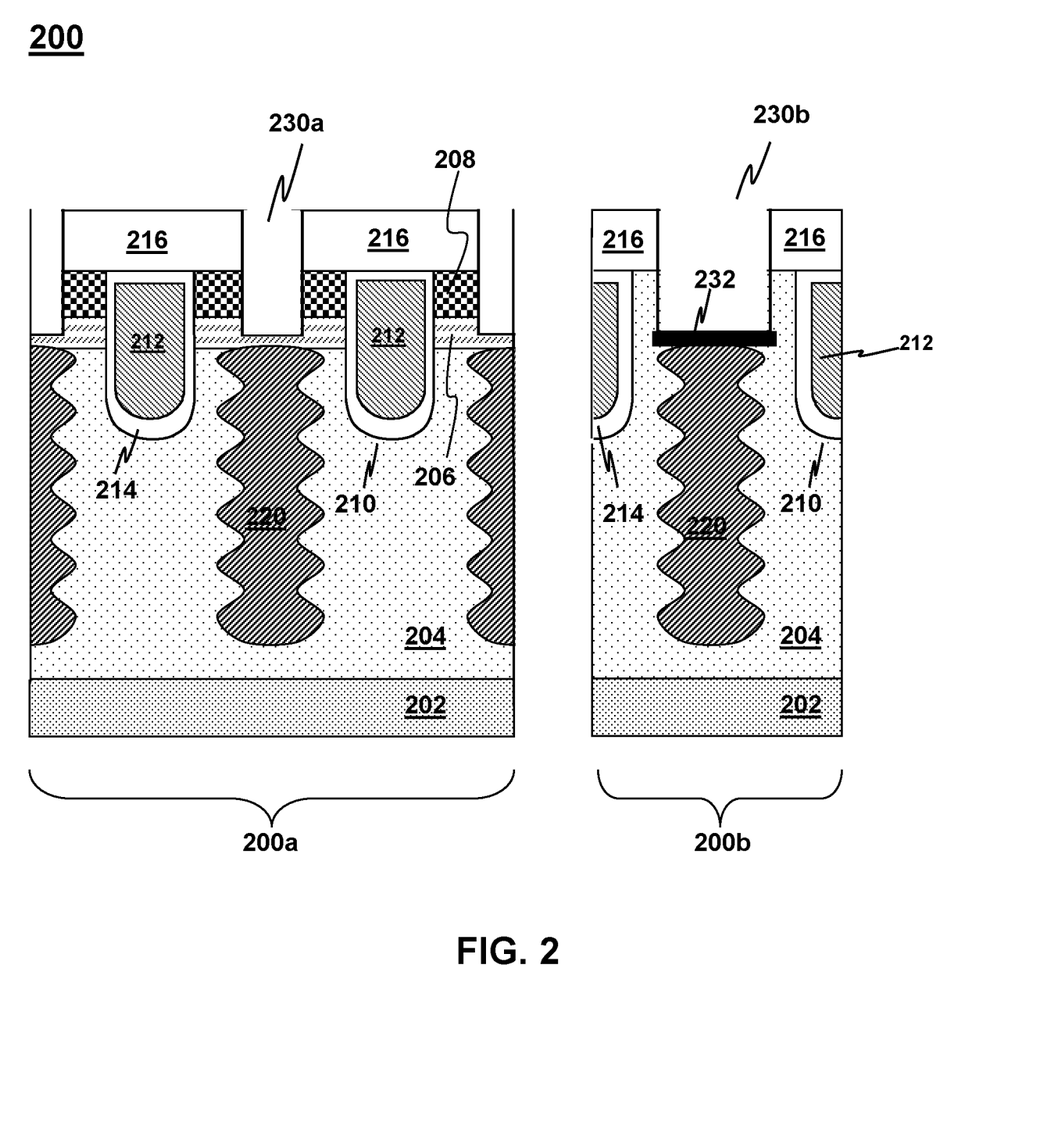
FIG. 2 is a cross-sectional view of portions of a power MOSFET device according to aspects of the present disclosure.

FIG. 2 is a cross-sectional view of portions of a power MOSFET device according to aspects of the present disclosure. The n-type power MOSFET device 200 of FIG. 2 includes an active cell area 200a and a Schottky diode area 200b. The active cell area 200a may comprise an array of device cells. Each device cell comprises an n-type lightly doped drift region 204 on top of a highly doped n-type semiconductor substrate 202, and a p-type body region 206 formed near the upper portions of the drift region 204. In addition, the device cell comprises a gate electrode 212 formed in a gate trench 210 extending in the body region 206 and the drift region 204, and a highly doped n-type source region 208 formed near the upper portions of the body region 206 on the opposite sides of a source contact trench 230a. A source contact (not shown) formed in the source contact trench 230a provides an external connection to the source region 208. The gate electrode 212 is electrically isolated from the source contact (not shown) by a dielectric layer 216.

The power MOSFET device 200 has a superjunction structure in the drift region including alternating first doped columns of the first conductivity type (i.e., n columns) and second doped columns of the second conductivity type (i.e., p columns) arranged in parallel. Each of the p columns 220 is formed under the source contact trench 230a and between two adjacent gate trenches 210. The n columns may comprise portions of the n drift region 204 that are situated adjacent to the p columns 220.

Similar to the active cell area 200a, the Schottky diode area 200b may include the n+ substrate 202, the n drift region 204 provided on top of the substrate 202, a gate electrode 212 formed in a gate trench 210 lined with a dielectric material 214 and an insulating layer 216 formed on the gate trench 210. The Schottky diode area 200b also includes the superjunction structure having alternating p doped columns 220 and n doped columns. A p column 220 is formed between two adjacent gate trenches 210 in the drift region 204. The n columns may comprise of the portions of the n drift region 204 that are situated adjacent to the p columns 220.

A Schottky contact trench 230b is formed in the drift region 204 between two adjacent gate trenches above the p column 220. A contact implant 232 is formed beneath the bottom of the Schottky contact trench 230b. A barrier metal (not shown) may be deposited over the surface of the Schottky contact trench 230b. By way of example, and not by way of limitation, the barrier metal may be titanium (Ti) that is deposited through physical vapor deposition (PVD), or it may be an alloy such as TiN which may be deposited by CVD or PVD. After the barrier metal has been deposited, a conductive material (tungsten) may be deposited by CVD in the Schottky contact trench 230b. Once the layer of tungsten has been deposited, it may be etched back in order to leave the tungsten in both the source contact trench 230a and the Schottky contact trench 230b. A Schottky contact is thus formed at sidewalls of the Schottky contact trench 230b. Metal may then be deposited over the entire surface and patterned to provide appropriate contacts to the source region and gate electrodes.

The width of the Schottky contact trench 230b may be adjusted to tune the leakage current (Idss). When the Schottky contact trench 230b is wider, the gap between the Schottky trench 230b and the gate trench 210 is narrower. As such, the leakage current may be reduced. The Schottky contact trench 230b is wider than the source contact trench 230a formed in the active cell area 200a. By way of example and not by way of limitation, the source contact trench 230a in the active cell area 200a may have a width of about 0.4 microns and the Schottky contact trench 230b is about 0.5 to 0.7 microns (μm) in width for 1.4 μm pitch size. In some embodiments, the gap between the Schottky contact trench 230b and the gate trench 210 may be less than 0.2 microns. In addition, the pitch of the gate trench may be between 1.3 and 1.5 microns for low voltage devices (e.g., 25 V), between 1.3 and 1.7 microns for a 30 V device, and between 3.5 and 5 microns for medium voltage devices (e.g., 200 V). The pitch of the p column is the same as the pitch for the device gate trench. With the integrated Schottky diode, the power MOSFET device may have a reduced body diode forward voltage drop ($V_f$) between 0.35 to 0.45V.

Figure 3:
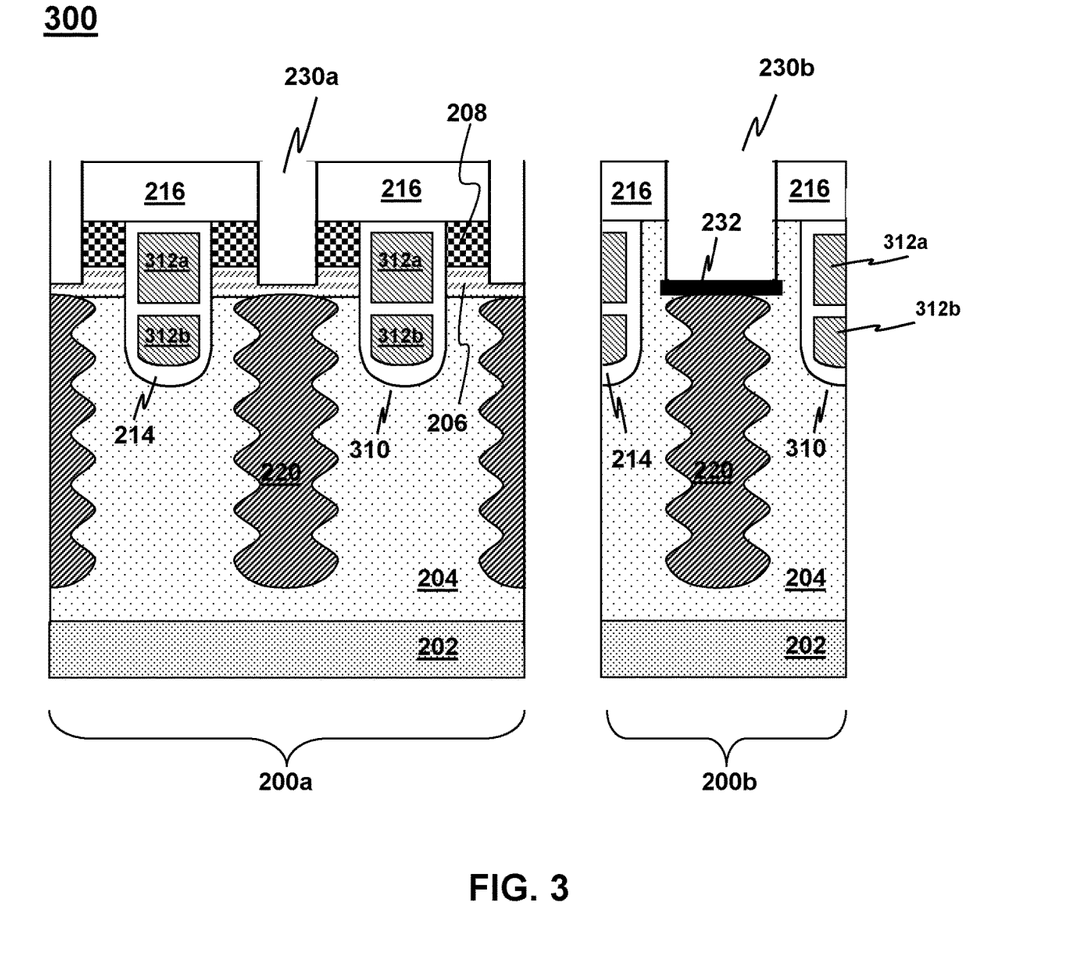
FIG. 3 is a cross-sectional view of portions of a power MOSFET device according to aspects of the present disclosure.

The power MOSFET 200 of FIG. 2 is shown as a single poly MOSFET device. Aspects of the present disclosure also applies to a shielded gate trench MOSFET device as shown in FIG. 3. Specifically, the power MOSFET device 300 is similar to the device 200 of FIG. 2, except that the gate trench 310 in the power MOSFET device 300 has a gate electrode 312a in an upper portion of the trench and a shield electrode 312b in a lower portion of the gate trench. Such a shielded gate trench (SGT) structure may allow for low gate charge and high switching frequency. Identical numeral labels shown in FIG. 3 and FIG. 2 represent identical component/element or equivalents thereof. Detailed description for these identical components is not repeated here for simplicity. As shown in FIG. 3, a Schottky contact is formed at sidewalls of the Schottky contact trench 230b.

Second Example

Figure 4:
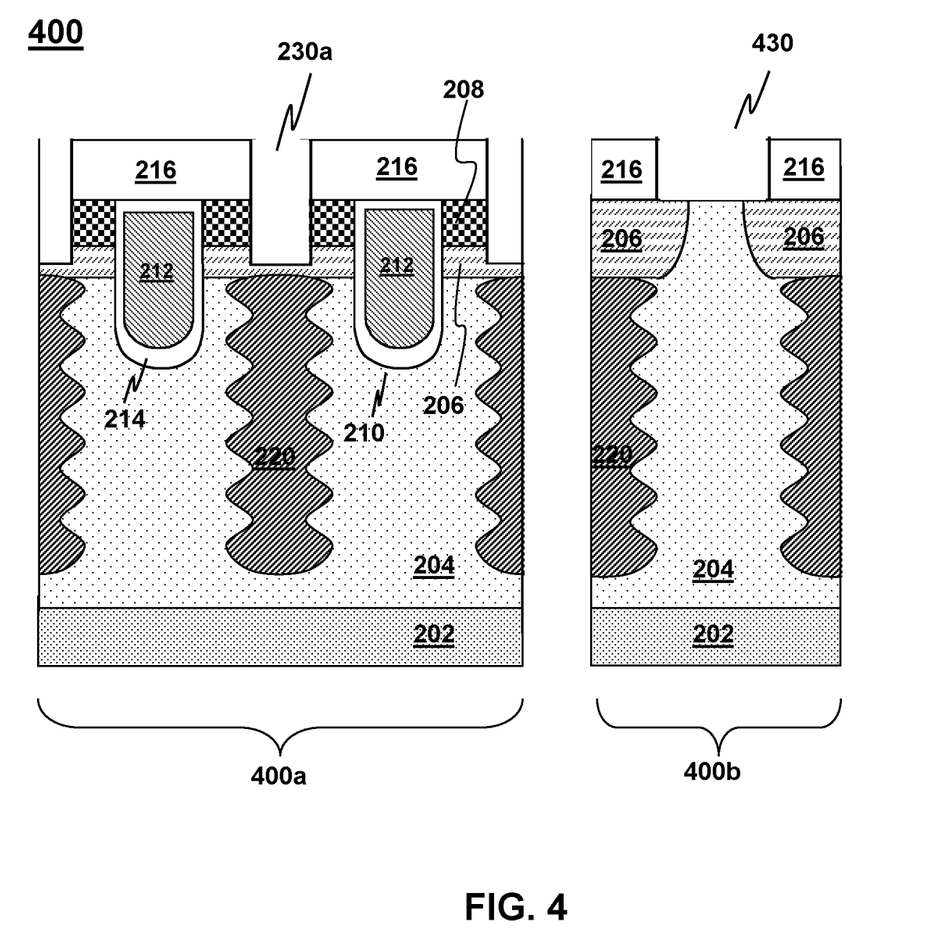
FIG. 4 is a cross-sectional view of portions of a power MOSFET device according to aspects of the present disclosure.

FIG. 4 shows a cross-sectional view of portions of a power MOSFET device 400 according to aspects of the present disclosure. The n-type power MOSFET device 400 of FIG. 4 includes an active cell area 400a and a Schottky diode area 400b. The active cell area 400a may comprise an array of device cells similar to the device cells show in FIG. 2. Identical numeral labels shown in FIG. 4 and FIG. 2 represent identical component/element or equivalents thereof. Detailed description for these identical components is not repeated here for simplicity. While each of the device cells in the active cell area 400a shown in FIG. 4 has a single gate poly in the gate trench 210, it should be noted that the device cells may alternatively have an SGT structure, namely a gate electrode in the upper portions of the gate trench and a shield electrode in the bottom portions of the trench.

The Schottky diode area 400b may include the n+ substrate 202, the n drift region 204 provided on top of the substrate 202, the p-type body region 206 formed near some upper portions of the drift region 202 and an insulating layer 216 formed on the body region 206. The Schottky diode area 400b also includes the superjunction structure having alternating p doped columns 220 and n doped columns. A p column 220 is formed under the p-type body region 206 in the drift region 204. The n columns may comprise of the portions of the n drift region 204 that are situated adjacent to the p columns 220.

A Schottky contact trench 430 is formed between two adjacent p columns 220 on top of the drift region 204. A barrier metal (not shown) may be deposited over the surface of the Schottky contact 430 followed by depositing tungsten in the contact trench. A Schottky contact is thus formed at the surface of the drift region 204 between two adjacent p columns 220. Metal may then be deposited over the entire surface to provide appropriate contacts to the source region and gate electrodes.

Figure 5:
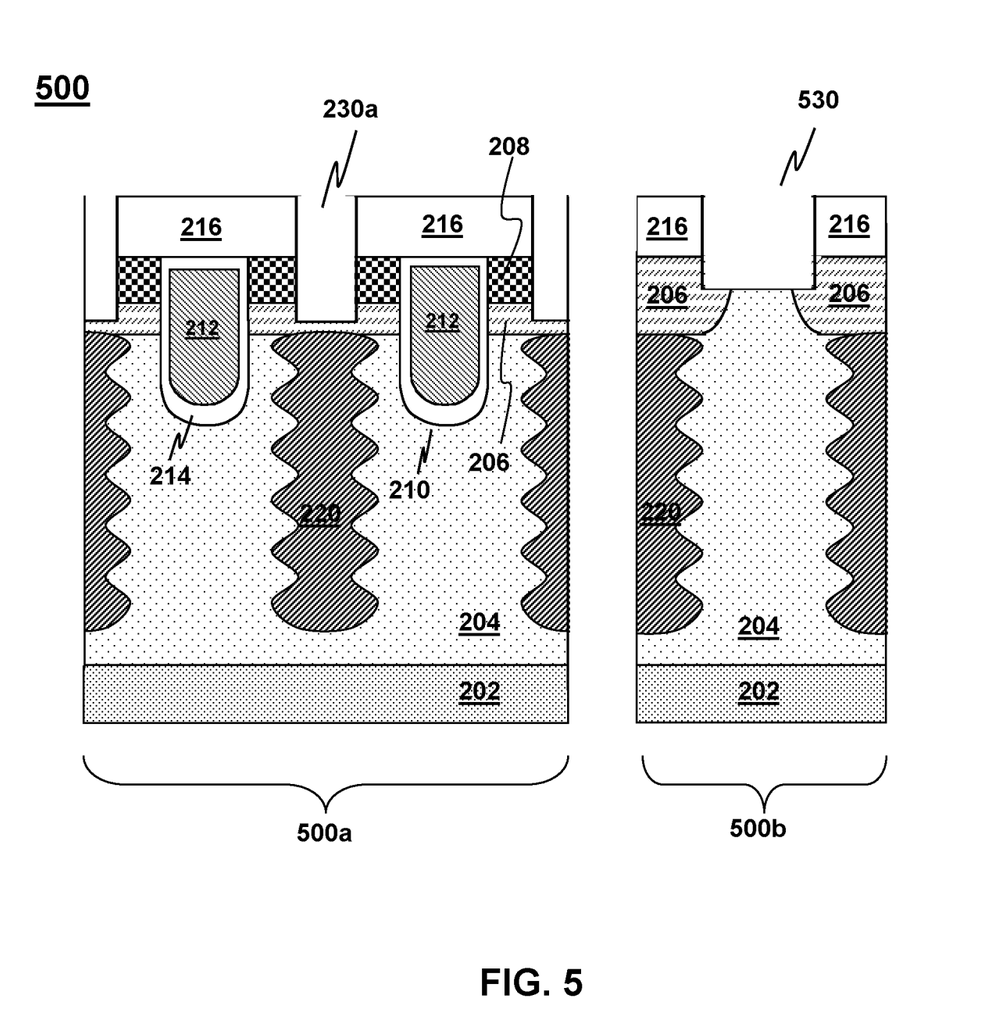
FIG. 5 is a cross-sectional view of portions of a power MOSFET device according to aspects of the present disclosure.

FIG. 5 shows another Schottky diode integrated into a power MOSFET device where the Schottky contact is also formed on the surface of the drift region between two adjacent p columns. Specifically, the power MOSFET device 500 is similar to the device 400 of FIG. 4, except that the Schottky contact trench 530 in the Schottky diode area 500b is extended into the upper portions of the drift region 204. Identical numeral labels shown in FIG. 5 and FIG. 4 represent identical component/element or equivalents thereof. Detailed description for these identical components is not repeated here for simplicity.

For this embodiment, the pitch of the gate trench may be between 1.3 and 1.5 microns for low voltage devices (e.g., 25 V), between 1.3 and 1.7 microns for a 30 V device, and between 3.5 and 5 microns for medium voltage devices (e.g., 200 V). The pitch of the p column is the same as the pitch for the device gate trench. With the integrated Schottky diode, the power MOSFET device may have a reduced body diode forward voltage drop ($V_f$) between 0.35 to 0.45V.

Fabrication Process

Figure 6:
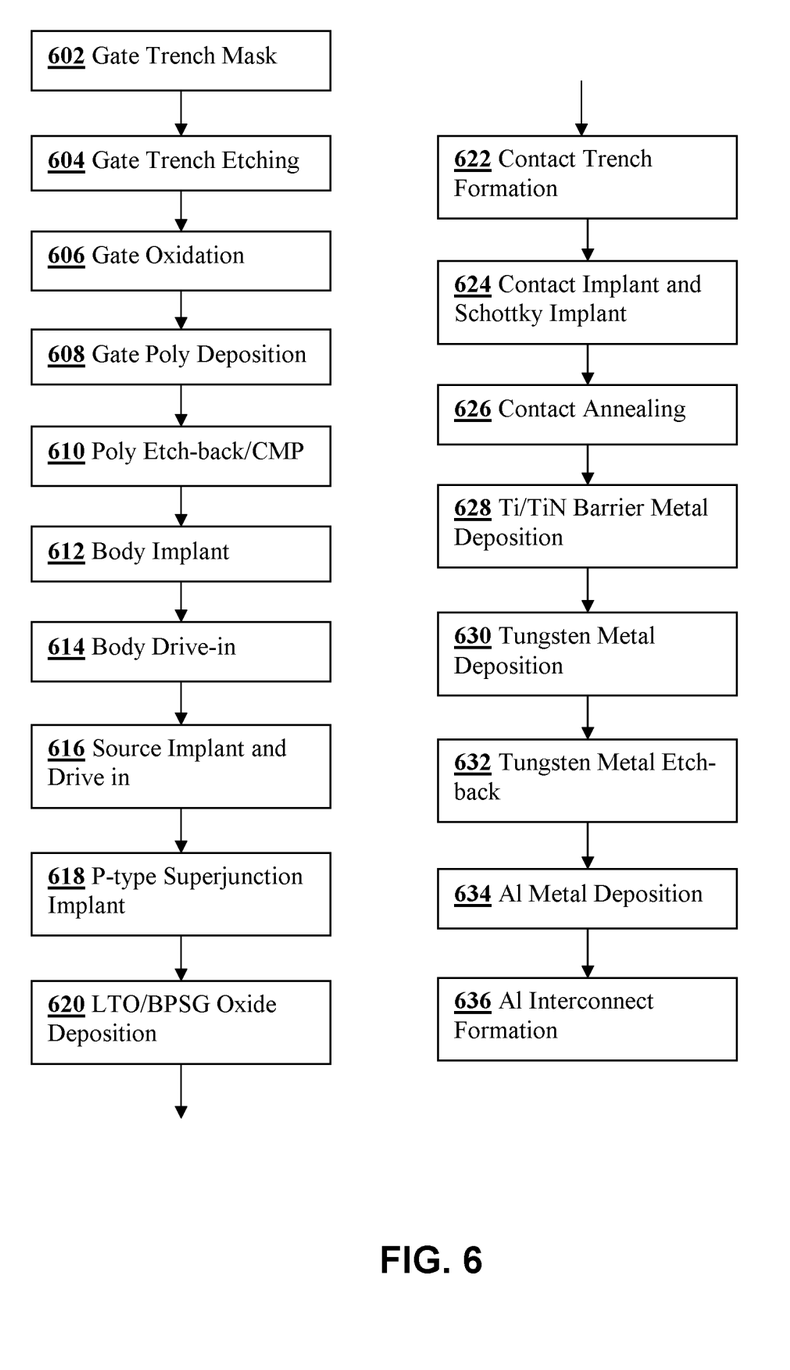
FIG. 6 is a flow chart illustrating a fabrication of a power MOSFET device according to aspects of the present disclosure.

FIG. 6 is a flow chart illustrating a fabrication process for a low voltage power MOSFET device according to aspects of the present disclosure. The following fabrication process describes a process for fabricating an n-type superjunction trench MOSFET device in which the source region and drain region for the device cells have n type conductivity and the body region has p type conductivity. It is noted that these conductivity types may be reversed in order to fabricate a p type superjunction trench MOSFET.

The process starts with a lightly doped n-type epitaxial layer (i.e., a drift region) on top of a heavily doped n-type semiconductor substrate as a starting material. At 602, a trench mask is applied on the drift region. In some embodiments, the trench mask may be an oxide layer which may be either grown or deposited over the drift region. The trench mask includes openings to define locations of a plurality of gate trenches for the trench transistors of the MOSFET device. For the devices where the Schottky contact is formed along the sidewalls of Schottky contact trenches (e.g., devices of FIGS. 2 and 3), the trench mask includes openings for gate trenches in both the active cell area and the Schottky diode area. For the devices where the Schottky contact is formed on the surface of the drift region between two adjacent p columns (e.g., devices of FIGS. 4 and 5), the trench mask has openings for gate trenches only in the active cell region and the entire Schottky diode area is covered by the mask. At 604, an etching process is performed and the corresponding portions of the underlying drift region are etched down to form a plurality of the gate trenches. The gate trenches may have a depth of about 1.0 microns. The width of the gate trenches may be as small as the process allows. By way of example and not by way of limitation, the width of the gate trenches is between 0.3 and 0.5 microns. The pitch of the gate trenches may be between 1.3 to 1.5 microns for a 25V device. Optionally, after the gate trenches have been formed and the trench mask has been removed, a sacrificial oxide layer (not shown) may be grown and then removed to improve the silicon surface.

An insulating layer (e.g., gate oxide) is then formed at 606 on the top surface of the drift region and along the inner surface of the gate trenches. At 608, a conductive material is then deposited over the gate oxide layer followed by an etch back process or a chemical-mechanical planarization (CMP) process at 610 to form a gate electrode in the gate trench. In some embodiments, the conductive material can be in-situ doped or undoped polysilicon, which requires polysilicon doping later on in the fabrication process.

For the devices where the Schottky contact is formed along the sidewalls of Schottky contact trenches (e.g., devices of FIGS. 2 and 3), a body implant is performed at 612 within the active cell area by applying a body mask on the drift region which covers the Schottky diode area and leaves the active cell area uncovered. For the devices where the Schottky contact is formed on the surface of the drift region between two adjacent p columns, a body implant is performed at 612 within the active cell area and certain area on the Schottky diode area by applying a body mask on the drift region which covers the locations of the Schottky contact trenches in the Schottky diode area and leaves the active cell area uncovered. The body mask is applied to implant the body dopant. The dopant ions are of the opposite conductivity type to the doping of the semiconductor substrate. In some embodiments, the dopant ions can be Boron ions for an n-type device. In some embodiments, Phosphorous or Arsenic ions can be used for p-type devices. Body drive-in is performed at 614 by applying heat to activate dopant atoms and drive dopant diffusion to form the body region.

A source implant is performed followed by a source diffusion process at 616. Specifically, a source implant mask is applied for source dopant implant on the drift region which covers the Schottky diode area and leaves the active cell area uncovered. The dopant ions are of the same conductivity type to the doping of the semiconductor substrate. In some embodiments, Phosphorus or Arsenic ions can be implanted for n-type devices. Source diffusion is then followed to form a doped source region in the body region.

The superjunction structure may be formed by selectively implanting P-type dopants at 618. Such implantation may be done through a mask to form P-columns in an N-type substrate. The gate electrode may then be electrically isolated from the source contact by depositing an oxide, such as a low temperature oxide (LTO) or borophosphosilicate glass (BPSG), as indicated at 620.

Source contact trenches and Schottky contact trenches are formed at 622. Specifically, a contact mask is applied on the dielectric layer with a pattern that has openings at the locations of source contact trenches in the active cell area and Schottky contact trenches in the Schottky diode area. An etch process is performed to remove the uncovered portions of the dielectric layer, and form the source contact trenches through the source region into the body region and the desired Schottky contact trenches in the Schottky diode area. Schottky contact trenches are wider than source contact trenches. By way of example and not by way of limitation, the source contact trench in the active cell area may have a width of about 0.4 microns and the Schottky contact trench may be about 0.5 to 0.7 microns in width, depending on the mesa width.

For the devices where the Schottky contact is formed along the sidewalls of Schottky contact trenches (e.g., devices of FIGS. 2 and 3), a p-type contact implant is carried out at 624 to form a contact implant region underneath each of the Schottky contact trenches and each of the source contact trenches. The contact implant region may be formed by performing an angle implant through the Schottky contact openings. By way of example and not by way of limitation, the implant is carried out with a dose of $1 \times 10^{12}$-$4 \times 10^{12}/cm^2$ at an energy level of about 20 to 40 KeV. The angle may be chosen depending on the desired Schottky contact width. It should be noted that each contact implant region is at least the width of the Schottky contact trench. In some embodiment, the angle may be between 10 to 15 degrees. Preferably the Schottky contact trench 230b is wider than a width of the p column 220 below the contact implant 232 for devices of FIGS. 2 and 3. For the devices where the Schottky contact is formed on the surface of the drift region between two adjacent p columns (e.g., devices of FIGS. 4 and 5), a light p-type Shannon implant may be carried out at 624 to form a contact implant region underneath each of the Schottky contact trenches. By way of example and not by way of limitation, the Shannon implant is performed through the Schottky contact openings with a dose of $1 \times 10^{12}$-$4 \times 10^{12}/cm^2$ at an energy level of about 20 to 40 Kev.

It should be noted that the barrier height may depend on the contact implant process. The Schottky barrier height is related to the leakage current drain to source $I_{dss}$ of the Schottky diode. As the barrier height increases, the leakage current decreases and the forward voltage drop increases. An annealing process indicated at 626 is then performed to activate the implantation.

Next at 628 a thin barrier metal layer (e.g., Titanium (Ti) or Titanium Nitride (TiN)) is deposited at the sidewall and the bottom of the source contact trenches and the Schottky contact trenches. The barrier metal may be heated by rapid thermal processing. Tungsten is then deposited into the remaining of the trenches at 630 followed with an etch-back process at 632. The barrier metal acts as a diffusion barrier between the tungsten plug and the semiconductor material in which the trenches are formed. A metal layer (e.g., Aluminum) may be deposited on top of the BPSG layer and the tungsten plug at 634. After a metal etch process, a standard etched aluminum alloy interconnect may be formed at 636.

The fabrication process for a medium or high voltage power MOSFET device is similar to the fabrication process of FIG. 6, except that the superjunction structure is formed at the beginning of the process. The superjunction structure may be formed by using a multi-layer sequence of epitaxy and implant to form p columns in an epitaxial n-type drift region. Ions are implanted into each successive epitaxial layer through an implant mask. The same mask may be used repetitively for implantation of each of the epitaxial layers to generate the p columns.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112(f).

What is claimed is:

1. A trench metal-oxide-semiconductor field-effect transistor (MOSFET) device, comprising:
    a plurality of alternating N columns and P columns extending in an epitaxial layer above a heavily doped substrate layer forming a superjunction structure;
    first, second, third and fourth gate trenches extending from a top surface of the epitaxial layer into the N columns of the superjunction structure;
    an insulated gate electrode formed in each of the first, second third, and fourth gate trenches;
    a source region and a body region formed between the first and second gate trenches, wherein a bottom of the body region reaches a top of a P column in the plurality of alternating N columns and P columns;
    a region of the epitaxial layer extending to the top surface of the epitaxial layer between the third and fourth gate trenches;
    a first contact trench between the first gate trench and the second gate trench and a second contact trench between the third gate trench and the fourth gate trench, wherein the first contact trench and the second contact trench are aligned to corresponding P columns in the plurality of alternating N columns and P columns, wherein the second contact trench extends from a top surface of the epitaxial layer to a depth that is shallower than the bottom of the body region.

2. The device of claim 1, further comprising a contact implant formed beneath a bottom of the second contract trench.

3. The device of claim 2, further comprising an electrode inside the second contact trench that forms electrical contact to a corresponding P column of the plurality of alternating N columns and P columns.

4. The device of claim 2, wherein the second contact trench is wider than the first contact trench.

5. The device of claim 2, wherein the second contact trench has a width of about 0.5 to 0.7 microns.

6. The device of claim 2, wherein a gap between the second contact trench and the adjacent gate trench is less than 0.2 microns.

7. The device of claim 1, wherein an operating voltage of the device is between 8 V to 40 V and each of the plurality of the gate trenches has a pitch between 1.3 and 1.7 microns.

8. The device of claim 1, wherein an operating voltage of the device is 30 V and each of the plurality of the gate trenches has a pitch between 1.3 and 1.7 microns.

9. The device of claim 1, wherein an operating voltage of the device is over 100 V and each of the plurality of the gate trenches has a pitch between 3.5 and 5 microns.

10. The device of claim 1, further comprising a shield electrode in a lower portion under the insulated gate electrode in an upper portion in each of the plurality of the gate trenches.

11. A method of fabricating a trench metal-oxide-semiconductor field-effect transistor (MOSFET) device, the method comprising:
   forming a plurality of alternating N columns and P columns extending in an epitaxial layer above a heavily doped substrate layer forming a superjunction structure;
   forming first, second, third and fourth gate trenches from a top surface of the epitaxial layer that extend into the N columns of the superjunction structure;
   forming an insulated gate electrode in each of the first, second third, and fourth gate trenches;
   forming a source region and a body region between the first and second gate trenches, wherein a bottom of the body region reaches a top of a P column in the plurality of alternating N columns and P columns, wherein a region of the epitaxial layer extends to the top surface of the epitaxial layer between the third and fourth gate trenches;
   forming a first contact trench between the first gate trench and the second gate trench and a second contact trench between the third gate trench and the fourth gate trench, wherein the first contact trench and the second contact trench are aligned to corresponding P columns in the plurality of alternating N columns and P columns, wherein the second contact trench extends from a top surface of the epitaxial layer to a depth that is shallower than the bottom of the body region.

12. The method of claim 11, wherein the second contact trench is wider than the first contact trench.

13. The method of claim 12, wherein a gap between the second contact trench and an adjacent gate trench is less than 0.2 microns.

14. The method of claim 11, wherein forming the first, second, third, and fourth gate trenches includes applying a gate trench mask on the drift region which uncovers locations for gate trench openings for the first and second gate trenches and gate trench openings for the third and fourth gate trenches.

15. The method of claim 11, wherein forming the first, second, third, and fourth gate trenches includes applying a gate trench mask on the epitaxial layer which uncovers locations for gate trench openings for the first and second gate trenches and covers locations for the third and fourth gate trenches.

16. The method of claim 11, wherein forming the body region includes applying a body mask that covers locations of the third and fourth gate trenches and leaves area locations of the first and second gate trenches uncovered.

17. The method of claim 11, wherein forming the source region includes applying a body mask that covers locations of the third and fourth gate trenches and leaves locations of the first and second gate trenches uncovered.

18. The method of claim 11, forming a contact implant region underneath the second contact trench, wherein the contact implant region is formed by performing an angle implant through an opening of the second contact trench.

19. The method of claim 18, wherein forming the contact implant region includes performing a Shannon implant through the opening of the second contact trench.

20. The method of claim 11, further comprising forming an insulated gate electrode in an upper portion and an insulated shield electrode in a lower portion of each of the first, second, third, and fourth gate trenches.

* * * * *